(12) United States Patent
Suzuki

(10) Patent No.: US 6,657,438 B2
(45) Date of Patent: Dec. 2, 2003

(54) TESTING UNIT AND A CONNECTOR TESTING APPARATUS USING THE SAME

(75) Inventor: Nobuhiro Suzuki, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 72 days.

(21) Appl. No.: 09/977,809

(22) Filed: Oct. 15, 2001

(65) Prior Publication Data
US 2002/0045379 A1 Apr. 18, 2002

(30) Foreign Application Priority Data
Oct. 17, 2000 (JP) ........................... 2000-317068

(51) Int. Cl.[7] ................ H01H 31/04; H01H 3/00; G01R 31/02
(52) U.S. Cl. ............... 324/538; 324/756; 324/761; 439/488; 439/315
(58) Field of Search ................... 324/538, 539, 324/754, 756, 761; 200/51.09, 51.1, 61.41, 61.42; 439/188, 315, 488, 489

(56) References Cited
U.S. PATENT DOCUMENTS

| | | | |
|---|---|---|---|
| 5,187,875 A | 2/1993 | Kuehling et al. | 33/541 |
| 5,410,115 A | 4/1995 | Hizume et al. | 200/61.76 |
| 5,467,023 A | 11/1995 | Takeyama | 324/754 |
| 5,604,440 A | 2/1997 | Tomikawa et al. | 324/539 |
| 5,614,820 A | * 3/1997 | Aoyama et al. | 324/538 |
| 5,627,473 A | * 5/1997 | Takani | 324/538 |
| 5,744,966 A | * 4/1998 | Sato | 324/538 |
| 5,760,592 A | * 6/1998 | Kodama et al. | 324/538 |

FOREIGN PATENT DOCUMENTS

| | | | |
|---|---|---|---|
| EP | 0 132 947 | 2/1985 | G01B/7/03 |
| EP | 0 860 703 | 8/1998 | G01R/31/04 |

* cited by examiner

Primary Examiner—Walter E. Snow
Assistant Examiner—Timothy J. Dole
(74) Attorney, Agent, or Firm—Gerald E. Hespos; Anthony J. Casella (57) ABSTRACT

A testing apparatus (10) is provided to securely detect a mounting error of a fittable member (5) on a connector (1). The testing apparatus (10) has a testing unit (20) for detecting an ajar state of the fittable member (5) on a housing (2) of a connector (1). The testing unit (20) is provided with an elastic contact (22) for elastically contacting the housing (2) of the connector I1) along locking direction (Y) in which the fittable member (5) is locked with the housing (2). This elastic contact (22) is provided with a switch (23) for detecting the ajar state of the fittable member (5) at a contact position of the elastic contact (22) with the housing (2).

7 Claims, 10 Drawing Sheets

FIG. 9

TESTING UNIT AND A CONNECTOR TESTING APPARATUS USING THE SAME

BACKGROUND OF THE INVENTION

1. Field of the Invention

The present invention relates to a testing unit and a connector testing apparatus using the same.

2. Description of the Related Art

Many industrial products have very small dimensional tolerances, and precise dimensional measurements of those products are required. However, conventional detecting means cannot detect dimensional deviations beyond tolerances with the precision that has been required in recent years. For example, a tolerance of about 0.6 mm conventionally has been accepted for parts of an electrical connector housing, such as a retainer or a cover. However, in recent years, this tolerance has been reduced to about 0.300 mm. Existing mechanical connector testing devices have been unable to detect dimensional deviations beyond such small dimensional tolerances due to deformation and shaking of the connector housing itself.

In view of the above, an object of the present invention is to provide a testing unit capable of securely testing a dimensional deviation of a specific part of a work piece beyond its tolerance. The invention also is directed to a connector testing apparatus that uses such a testing unit.

SUMMARY OF THE INVENTION

The invention is directed to a testing unit for detecting a dimensional deviation of a specific part of a work piece beyond its tolerance. The work piece may, for example, be a grommet or an outer tube used for an automotive vehicle. The testing unit comprises an elastic or resilient contact that can be brought elastically or resiliently into contact with the work piece. The testing unit also comprises a detecting portion on the contact for detecting the dimensional deviation of the work piece at the position where the contact engages the work piece. Accordingly, the detecting portion of the contact can reach a proper reference position for detecting dimensional deviations beyond a tolerance even if there is a variation in the final dimensions of the work piece, or if the work piece is shaky or deformed. The detecting portion detects a dimensional deviation of the specific part of the work piece at the contact position of the contact with the work piece. Thus, the deviation can be detected as precisely as possible.

The resilient contact preferably comprises an outer sleeve fixed in advance in a specific position and an inner sleeve that is mounted slideably to the outer sleeve. At least one of the sleeves is formed with a step that restricts the projecting distance of the inner sleeve toward the work piece. Thus, the inner sleeve is held resiliently in contact with the work piece for movement forward and backward in a testing state where the work is tested.

The inner sleeve preferably is fit for sliding movement in or on the outer sleeve. A biasing member preferably is provided between the inner sleeve and the outer sleeve for biasing the inner sleeve toward the work piece.

The detecting portion preferably comprises a switch mounted at a location on the inner sleeve that contacts the work piece in its proper position.

The elastic contact and the detecting portion preferably are provided in a testing device of a connector testing apparatus for testing a housing of a connector. In this embodiment, a dimensional deviation of the housing beyond its tolerance can be detected when the housing of the connector is tested.

The switch preferably comprises a fixed pin and a movable pin that is movable with respect to the fixed pin. The electric relationship between the fixed pin and the movable pin is changed when the switch contacts the work piece in its proper position.

The invention also is directed to a connector testing apparatus that has a fittable member with a locking portion that can be inserted into a housing in an insertion direction and then locked into the housing in a locking direction. The locking direction is aligned at an angle to the insertion direction. The testing apparatus comprises at least one testing unit for testing a mounted state of the fittable member mounted on the connector. The testing apparatus may further comprise a detecting portion for detecting an ajar state of the fittable member at a contact position where the resilient contact is in contact with the housing.

The connector testing apparatus may further comprise a connector receptacle for holding the connector and a testing device. The testing device substantially faces the connector receptacle and is adapted to test an electrical connection of the connector held by the connector receptacle. The testing apparatus further comprises means for displacing the connector receptacle and the testing device relative to each other between a separated state where they are spaced from each other and a testing state where they are adjacent to each other. A testing unit is in the testing device for testing a mounted state of the fittable member mounted on the connector held by the connector receptacle in the testing state. The elastic contact member preferably is moved in the locking direction for elastically contacting the housing of the connector held by the connector receptacle.

The fittable member may be a cover with a lock for locking terminals in the housing or a retainer for doubly locking the terminals already locked by locking portions in the housing.

These and other objects, features and advantages of the present invention will become apparent upon reading of the following detailed description of preferred embodiments and accompanying drawings.

BRIEF DESCRIPTION OF THE DRAWINGS

FIGS. 3(A) and 3(B) are schematic enlarged partial sections showing a general state of a mounting error of a cover member as a fittable member in the connector of FIG. 1, wherein FIG. 3(A) shows a normal state and 3(B) shows a mounting-error state.

FIGS. 4(A) and 4(B) are enlarged schematic partial sections showing another state of the mounting error of the cover member in the connector of FIG. 1, wherein FIG. 4(A) shows a normal state and 4(B) shows a mounting-error state.

DETAILED DESCRIPTION OF THE PREFERRED EMBODIMENTS

Figure 5:
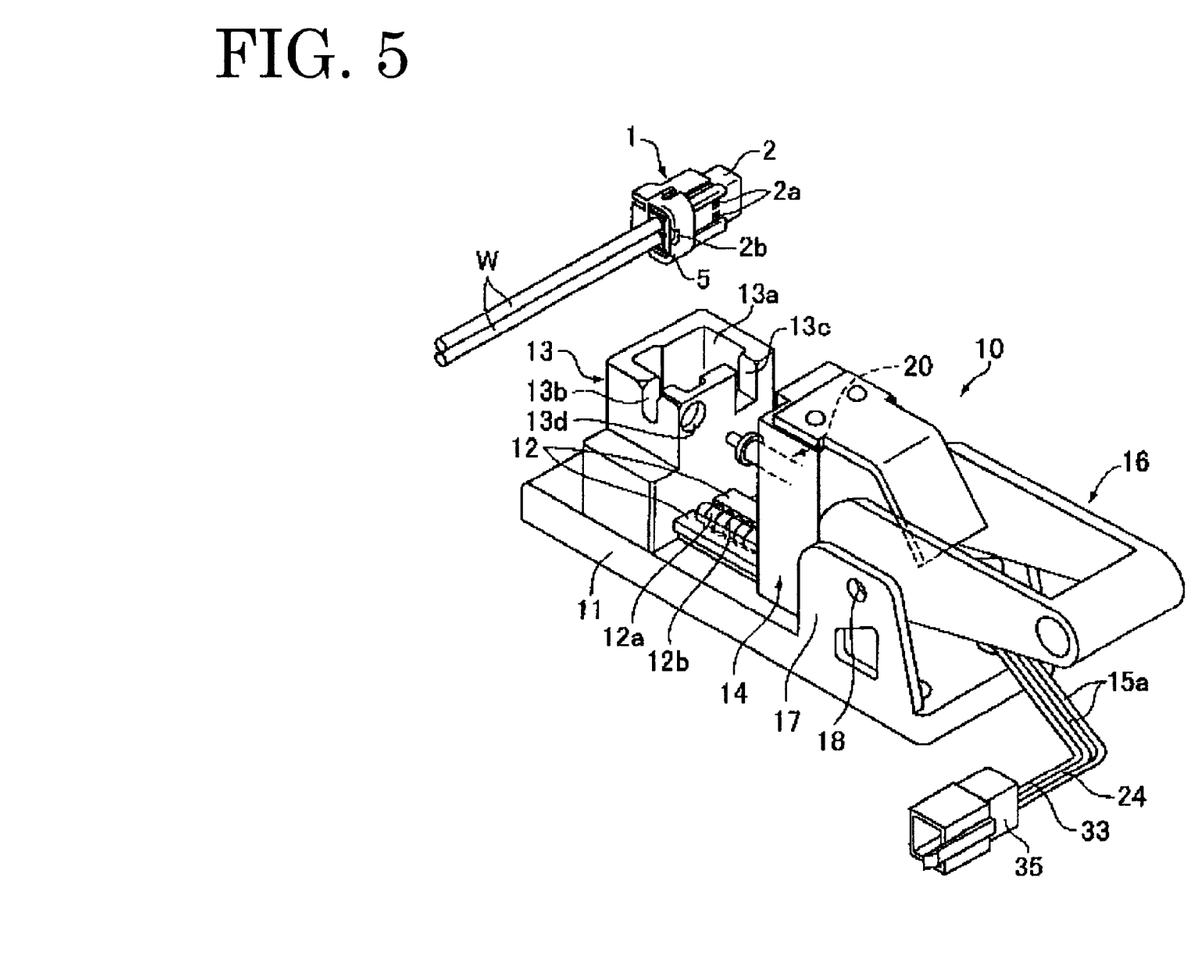
FIG. 5 is a perspective view showing a separated state of a connector testing apparatus according to one embodiment of the invention.
Figure 6:
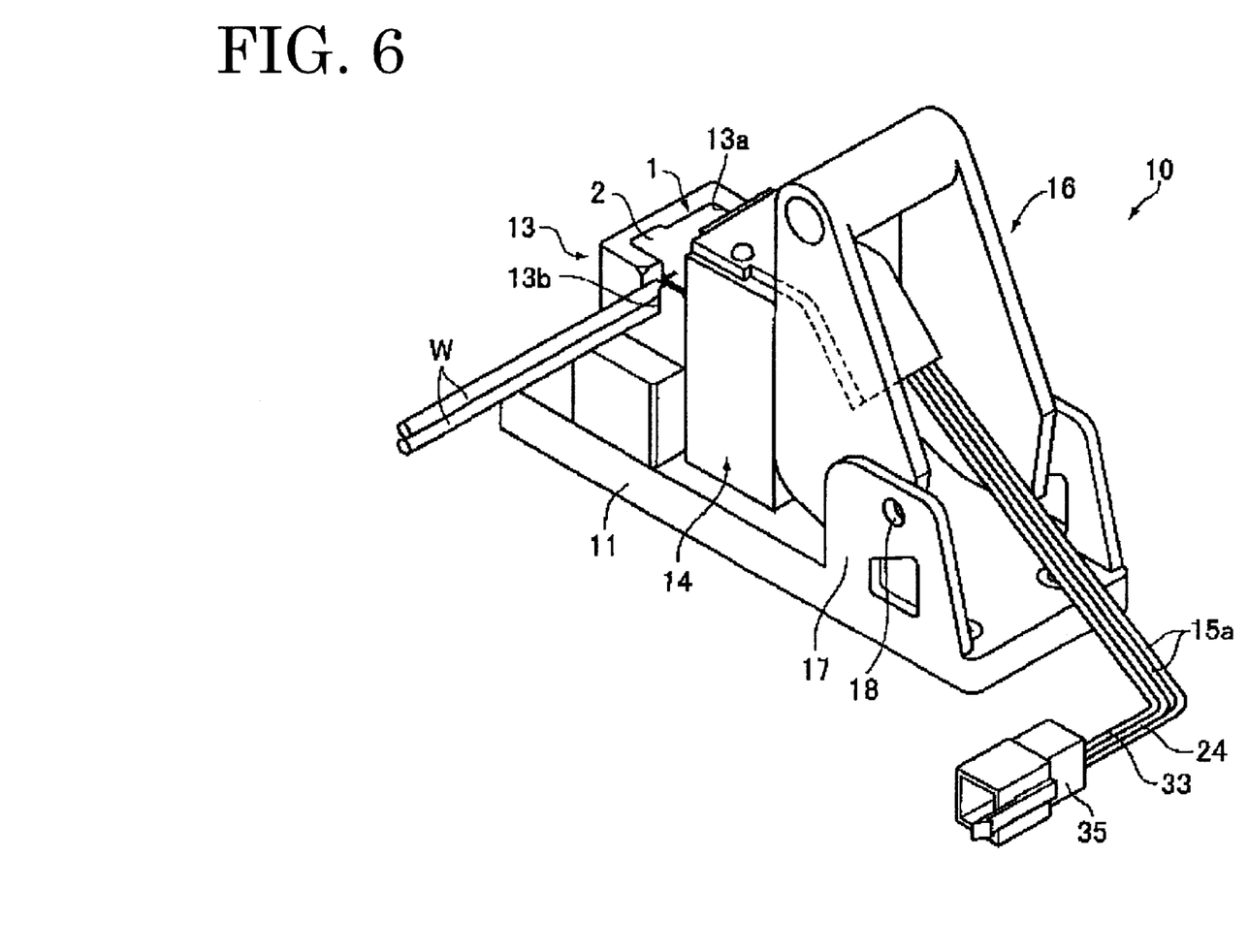
FIG. 6 is a perspective view showing a testing state of the connector testing apparatus according to one embodiment of the invention.
Figure 7:
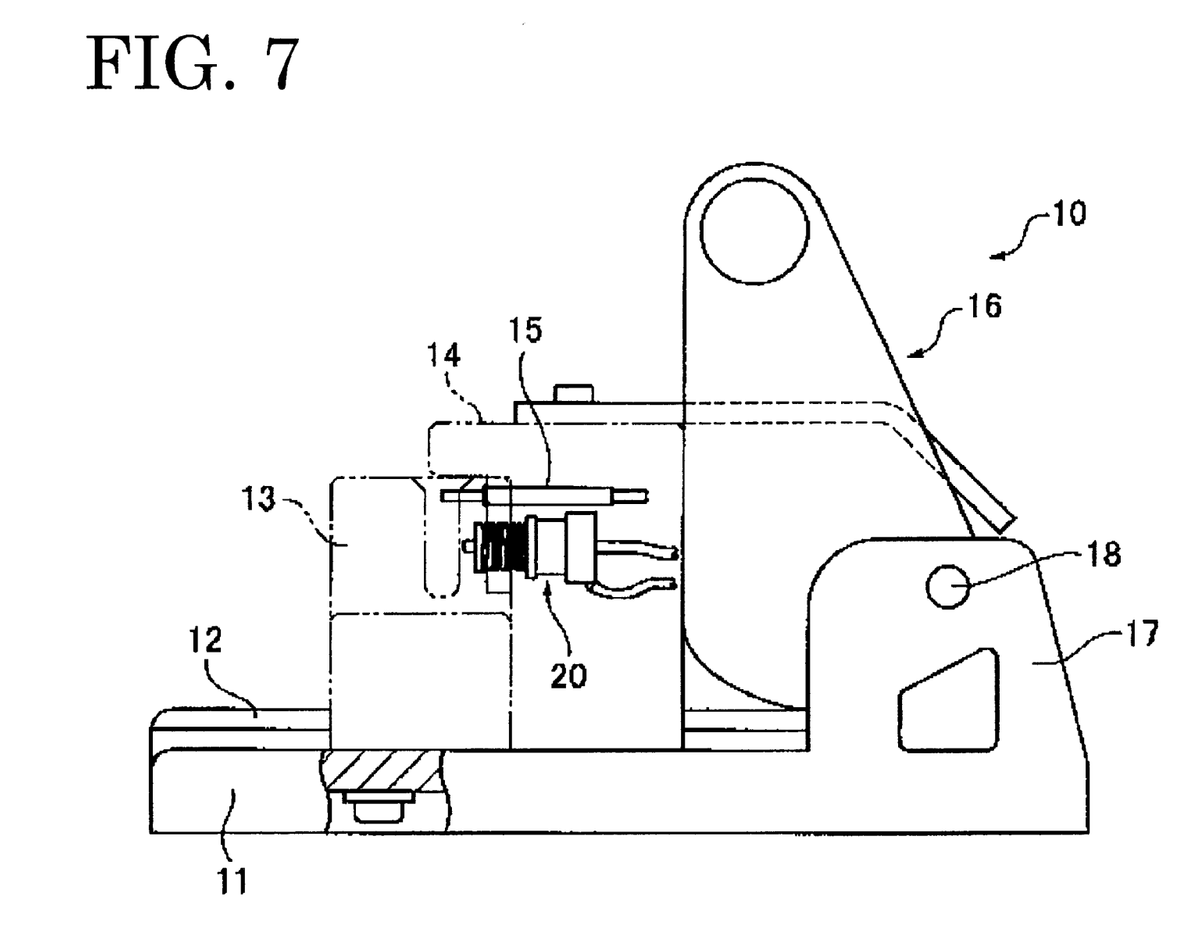
FIG. 7 is a side view partly cut away showing the connector testing apparatus of FIG. 5.

A connector testing apparatus according to the invention is identified by the numeral 10 in FIGS. 5–7. The connector testing apparatus 10 is adapted to test an electrical connection of a connector 1 and a mounted state of a cover 5 shown in FIGS. 1 and 2.

Figure 1:
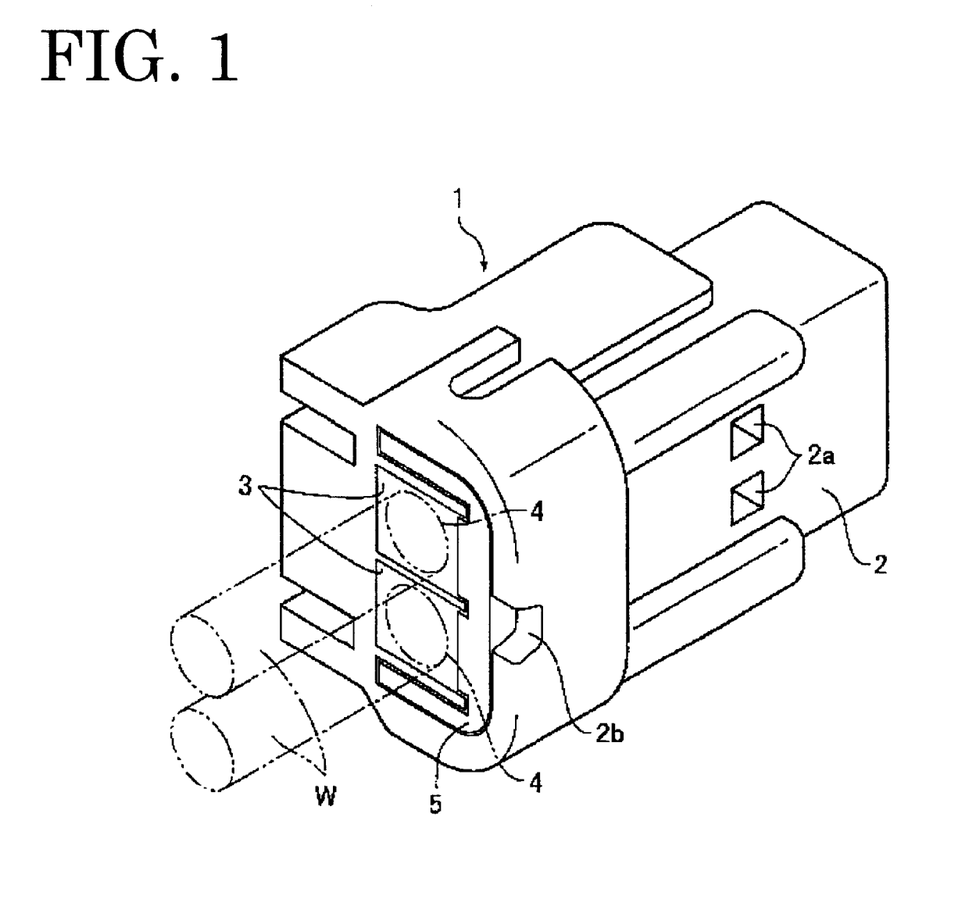
FIG. 1 is a perspective view of a connector that can be tested by the invention.
Figure 2:
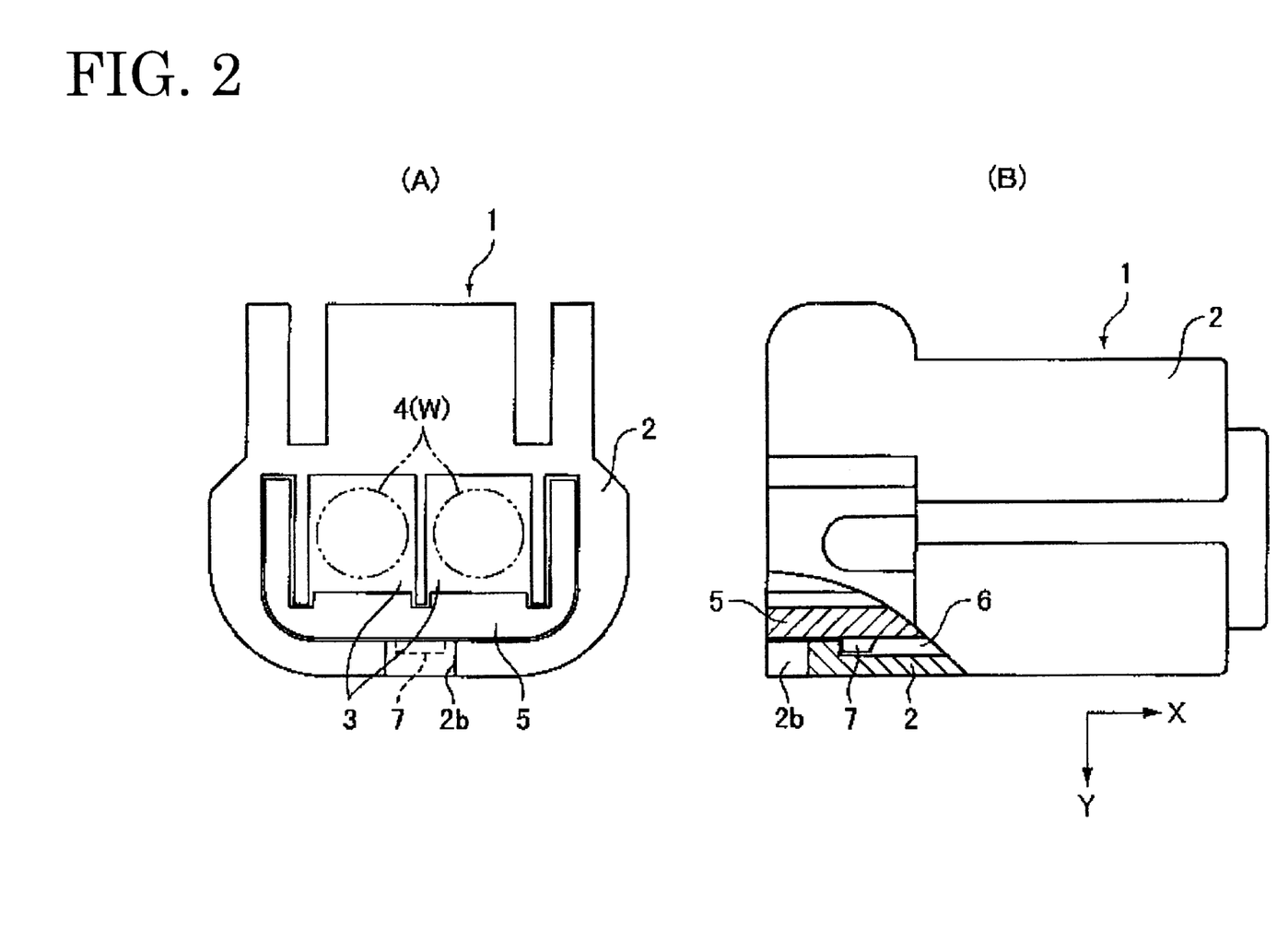
FIGS. 2(A) and 2(B) are a rear view and a side view partly cut away showing the outer configuration of the connector of FIG. 1.

The connector 1 comprises a housing 2, as shown in FIGS. 1 and 2. The housing 2 is formed e.g. of a synthetic resin material, and has a plurality of cavities 3 formed therein. Flexible locking arms (not shown) are formed integrally or unitarily in the housing and project into the cavities 3. The connector 1 further comprises terminals 4 that are connected with wires W. The terminals 4 are locked in the cavities 3 by the flexible locking arms. More particularly, the terminals 4 engage the lock arms during insertion of the terminals 4 into the housing 2, and cause the locking arms to deform elastically or resiliently away from the cavities 3. The locking arms return substantially to their original shapes when the terminals 4 reach their completely inserted position for automatically locking the terminals 4 in the housing 2.

The locking arms cannot be too large. Accordingly, the connector 1 includes a cover 5 that is mounted at a specified position on the housing 2 after the terminals 4 have been inserted. The cover 5 engages the terminals 4, and thus doubly locks the terminals 4 in the housing 1. Some known connectors rely exclusively on locking portions formed on the cover for locking the terminals in the housing.

The cover 5, as shown in FIGS. 2(A) and 2(B), is a U-shaped member with a cross section that corresponds to the cross section of the housing 2. The cover 5 is inserted onto the housing 2 in an insertion direction (X) that is substantially parallel to the terminal-insertion direction. A projection 7 is formed at the bottom of the cover 5 and is displaceable in a locking direction (Y) to fit into a recess 6 formed at the bottom of the housing 2. The locking direction (Y) is substantially normal to the insertion direction (X). An end surface of the cover 5 is substantially flush with an end surface of the housing 2 when the projection 7 of the cover 5 is fit in the recess 6 of the housing 2. Additionally, unillustrated locking projections in the cover 5 lock the terminals 4 when the projection 7 engages the recess 6.

The connector testing apparatus 10 for testing the connector 1 has an elongate substantially rectangular resin base 11, as shown in FIGS. 5 and 6. Two rails 12 are formed integrally on the base 11 and extend substantially parallel to the longitudinal direction of the base 11. A connector receptacle 13 for holding and positioning the housing 2 of the connector 1 is fixed at one end of the rails 12. A testing device 14 is arranged at the other end of the rails 12 and is displaceable toward and away from the connector receptacle 13.

The connector receptacle 13 includes an upwardly open recess 13a, and the housing 2 of the connector 1 can be inserted into or withdrawn from the receptacle in a direction substantially normal to the displacement direction of the testing device 14. The recess 13a is formed such that the housing 2 is placed with its longitudinal axis substantially normal to the longitudinal direction of the base 11, and so that the bottom surface of the housing 2 substantially faces the testing device 14.

Figure 3:
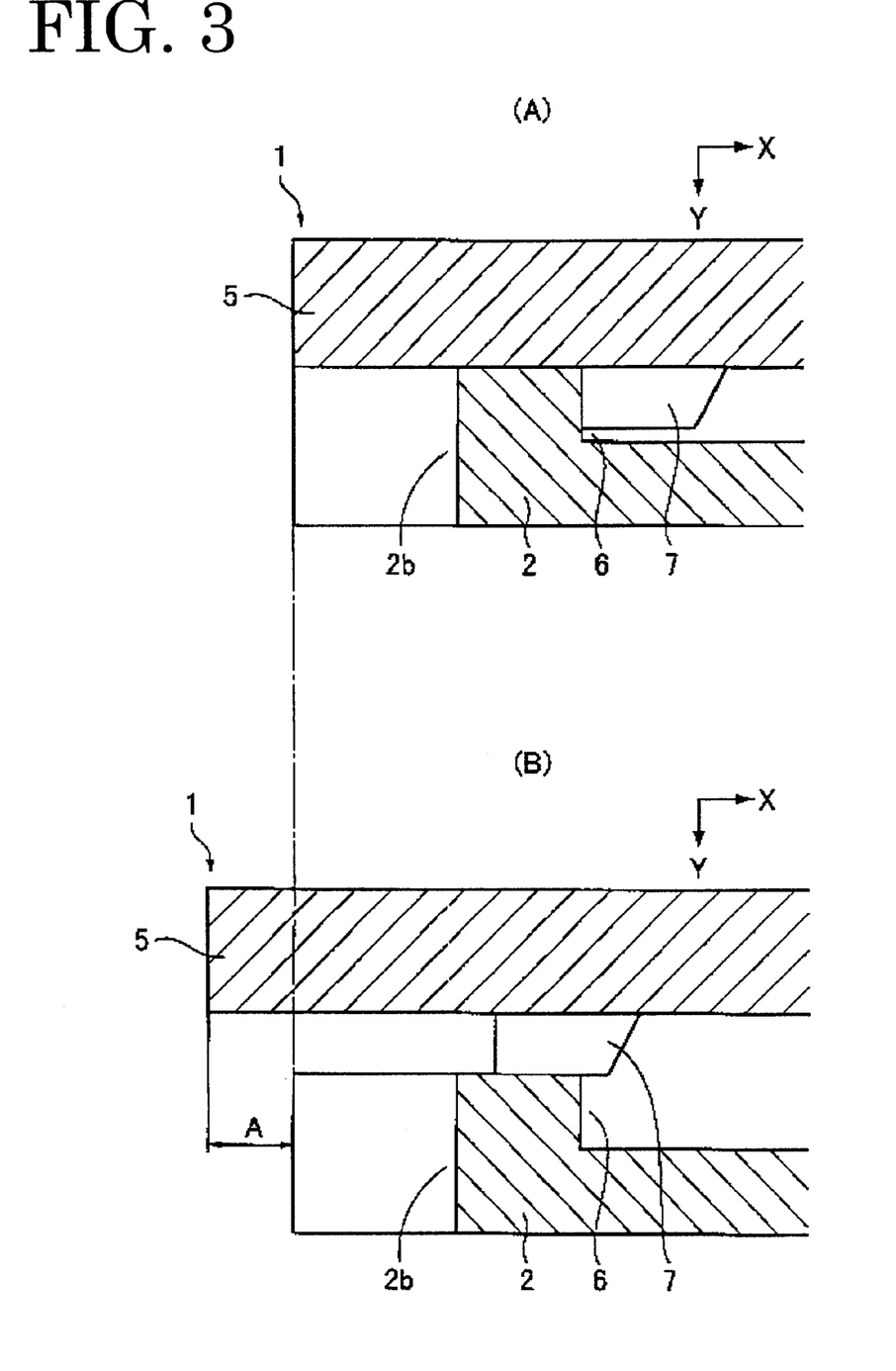

The housing 2 and the cover 5 of the connector often experience a mounting error. For example, the cover 5 may project back by a distance A from its proper position on the housing 2, as shown in FIG. 3(B). Accordingly, the connector testing apparatus 10 must have a detecting means capable of detecting this projected amount.

The opening of the recess 13a shown in FIG. 5 is dimensioned and configured to insert and withdraw the housing 2 in its widthwise direction (vertical direction in the state shown in FIG. 1). Thus, the housing 2 can be pushed forcibly into the recess 13a if the projecting distance A of the cover 5 with respect to its correct locking state in the housing 2 (see FIG. 3(B)) is small. On the other hand, a large projecting distance A can be detected because the housing 2 cannot be mounted into the recess 13a.

The recess 13a is formed with a notch 13b at one side, as shown in FIG. 5 for avoiding interference with the wires W that extend from the connector 1 held therein. On the other hand, the housing 2 is formed with insertion holes 2a to test an electrical connection and a notch 2b to test a mounted state. The connector receptacle 13 is formed with a notch 13c and an opening 13d that align respectively with the insertion holes 2a and the notch 2b and that face the testing device 14.

The testing device 14 has probe pins 15 that correspond in number to the contacts of the housings 2. The probe pins 15 are moved into the testing state shown in FIGS. 6 and 7 and approach the housing 2 held in the connector receptacle 13. As a result, the probe pins 15 move through the notch 13c of the connector receptacle 13, through the insertion hole 2a of the housing 2 and into contact with the terminals 4 in the housing 2. The probe pins 15 are connected with a plug 35 via lead wires 15a and are connected further with an unillustrated electrical connection testing apparatus via the plug 35. Further, the testing device 14 is guided in the longitudinal direction of the base 11 by a guide bar 12a provided between the rails 12, and is biased toward a toggle lever 16 by a coil spring 12b mounted on the guide bar 12a between the connector receptacle 13 and the testing device 14.

Mounting plates 17 extend from the base 11 at the end of the rails 12 opposite the connector receptacle 13, and the toggle lever 16 is mounted rotatably to a pin 18 that penetrates through mounting plates 17. Rotation of the toggle lever 16 enables the testing device 14 to be brought to the testing state and to the separated state so as to enable an electrical connection test.

A testing unit 20 for testing the cover 5 of the connector 1 held in the connector receptacle 13 is arranged in the testing device 14. The testing unit 20 is adapted to detect a slight ajar state of the cover 5 with respect to the housing 2 of the connector 1.

Figure 4:
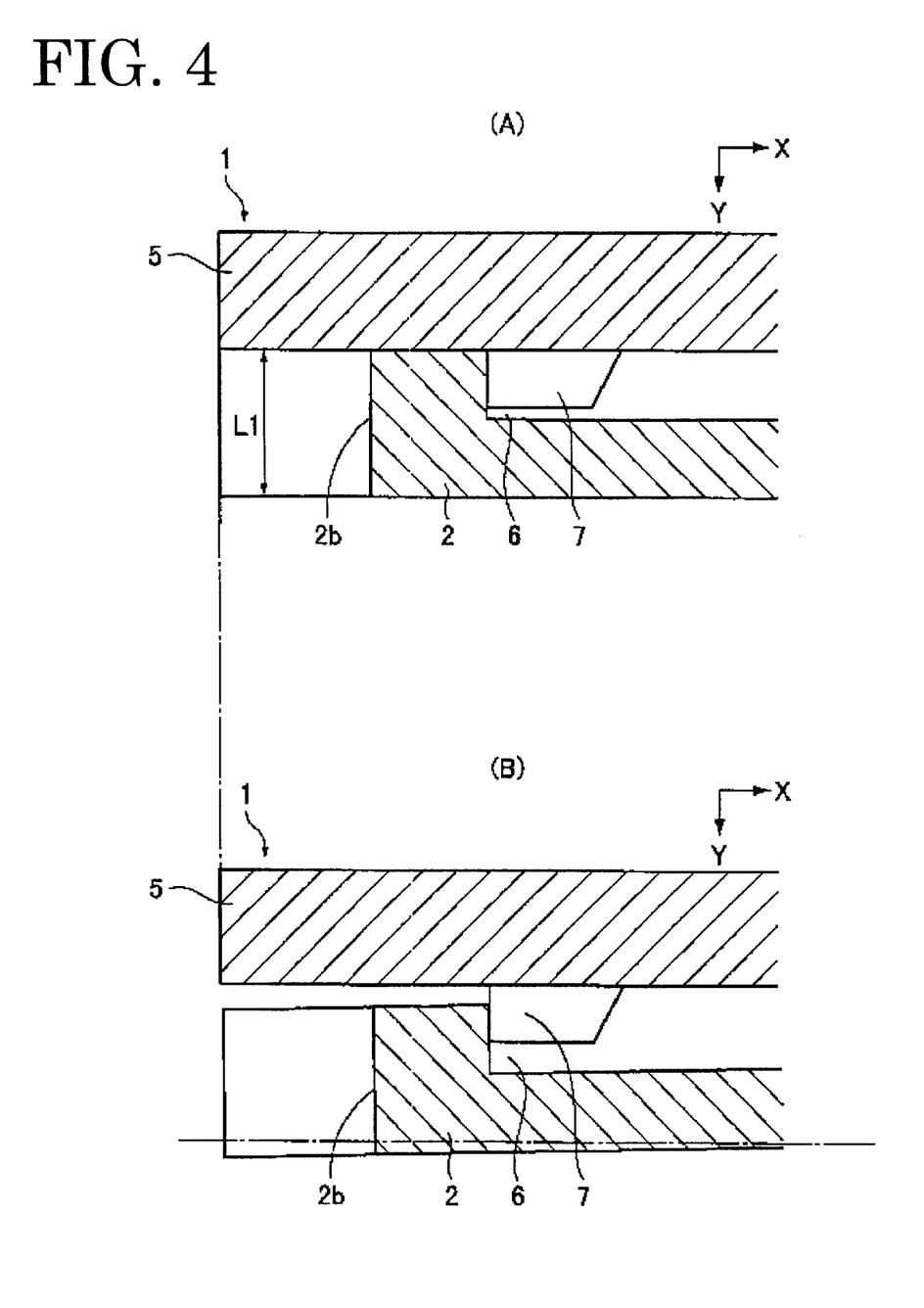

FIGS. 4(A) and 4(B) show a mounting error where the cover 5 projects in the locking direction (Y) despite the fact that the cover 5 is inserted in the insertion direction (X) to its proper insertion position.

The testing unit 20 has a pin-shaped testing member that can be inserted through the notch 2b in the bottom of the housing 2 to face the cover 5. The testing member cannot be brought into contact with the cover 5 if the cover 5 is ajar. In other words, proper mounting of the cover 5 can be tested mechanically. An attempt to detect the ajar state with a known switch pin enables a detectable dimensional precision of at most about 0.6 mm due to deformation, shaking or variations of finished dimensions of the housing 2. However, an error can be detected at a dimensional precision of about 0.30 mm in the embodiment described herein.

Figure 8:
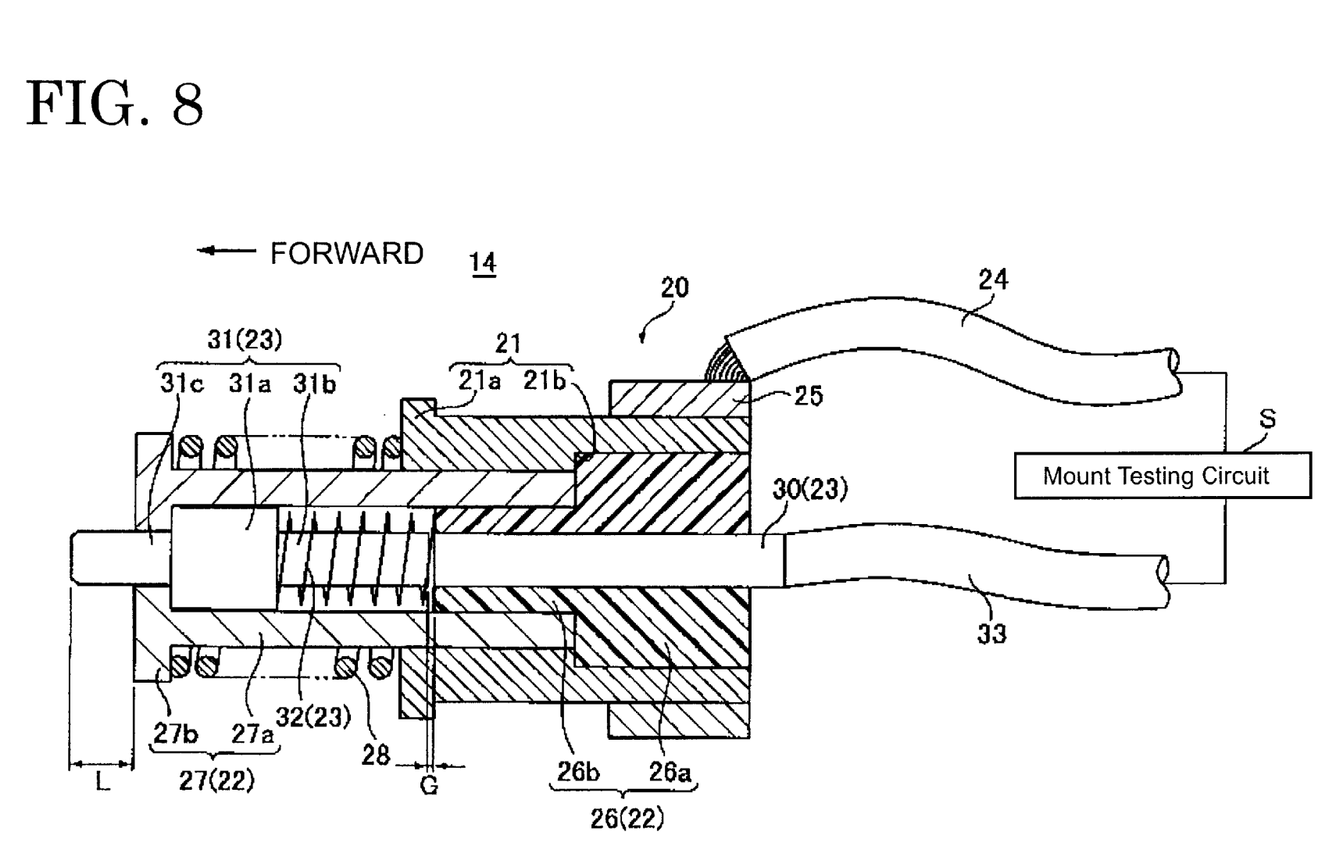
FIG. 8 is a section of a testing device of the connector testing apparatus of FIG. 5.

The testing unit 20 includes an outer sleeve 21 formed of an electrically conductive material and fixed to the testing device 14, as shown in FIG. 8. An inner sleeve 22 is arranged slideably and concentrically in the outer sleeve 21, and a switch pin 23 is arranged concentrically in the inner sleeve 22. The testing device 14 faces forward toward the connector receptacle 13.

The outer sleeve 21 is secured to the testing device 14, and a conductive ring 25 is pressed on the outer circumference of the rear end of the outer sleeve 21. A lead wire 24 is soldered to the conductive ring 25 and is connected with a testing circuit S of an unillustrated electrical connection testing apparatus. A flange 21a is formed at the front end surface of the outer sleeve 21, and a step 21b is formed in the inner circumferential surface of the outer sleeve 21 for specifying a projecting position of the inner sleeve 22. The rear of the step 21b has a larger diameter so that the front end of the inner sleeve 22 is received by the back surface of the step 21b.

The inner sleeve 22 comprises an insulating sleeve 26 and a conductive sleeve 27 that are assembled concentrically. The insulating sleeve 26 includes concentrically arranged large and a small diameter portions 26a and 26b that are integral or unitary with one another. The large-diameter portion 26a is disposed slideably at the rear of the outer sleeve 21 for contact with the step 21b of the outer sleeve 21. The conductive sleeve 27 includes a tubular portion 27a that extends forward from the rear end and a flange 27b at the front end. The small-diameter portion 26b of the insulating sleeve 26 is pressed into the rear end of the tubular portion 27a of the conductive sleeve 27. A coil spring 28 is mounted on the conductive sleeve 27 between the flange 27b and the flange 21a of the outer sleeve 21. Thus, the inner sleeve 22 is biased forward to project to a position defined by the step 21b. As a result, the inner sleeve 22 can be brought elastically into contact with the housing 2 of the connector 1 during a mounted-state testing to adjust a position where the switch pin 23 contacts the cover member 5 (see FIG. 9).

The switch pin 23 has a switch formed by a fixed pin 30 pressed into to the insulating sleeve 26 of the inner sleeve 22, a movable pin 31 slideably arranged longitudinally in the conductive sleeve 27 and a coil spring 32 for biasing the movable pin 31 forward.

The fixed pin 30 is an electrically conductive member secured in the insulating sleeve 26 with its front end flush with the end surface of the small-diameter portion 26b of the insulating sleeve 26. The rear end of the fixed pin 30 projects slightly backward from the insulating sleeve 26, and a lead wire 33 connected with the mount testing circuit S is soldered to this rear end.

The movable pin 31 is an integrally formed electrically conductive member with a large-diameter portion 31a held in sliding contact with the inner circumferential surface of the conductive sleeve 27. A connecting portion 31b projects substantially concentrically at the rear end of the large-diameter portion 31a, and a small-diameter contact portion 31c projects substantially concentrically at the front end of the large-diameter portion 31a. The movable pin 31 forms a so-called A-contact in cooperation with the fixed pin 30.

The large-diameter portion 31a supports the entire movable pin 31 in the conductive sleeve 27 and electrically connects the movable pin 31 with the conductive sleeve 27.

This large-diameter portion 31a is biased forward by the coil spring 32 into contact with the inner end wall of the conductive sleeve 27. The connecting portion 31b functions as a contact for the fixed pin 30 that is opposed to the fixed pin 30 and spaced therefrom by a gap G. The large-diameter portion 31a is held in contact with the inner end wall of the conductive sleeve 27. The gap G enables a displacement stroke of the movable pin 31.

The contact portion 31c contacts the cover 5 of the connector 1 during the mounted-state testing to be described later (see FIG. 9). A projecting length L of the contact portion 31c from the conductive sleeve 27 is set precisely to a distance L1 (see FIG. 4A) from the bottom surface of the housing 2 of the connector 1 to be tested to the bottom surface of the cover 5. Thus, upon contacting the bottom surface of the cover 5 in its proper position, the contact portion 31c is displaced slightly backward to connect the connecting portion 31b with the fixed pin 30.

The fixed pin 30 of the switch pin 23 is connected with the mount testing circuit S by the lead wire 33, and the movable pin 31 is connected with the mount testing circuit S via the conductive sleeve 27, the outer sleeve 21, the conductive ring 25 and the lead wire 24. The mount testing circuit S can detect the ajar state of the cover 5 by detecting whether the pins 30, 31 contact each other. The lead wires 24, 33 are connected with the plug 35 shown in FIG. 5 and are connected with the mount testing circuit S via this plug 35.

The toggle lever 16 can be laid down to leave the connector receptacle 13 and the testing device 14 separated from each other as shown in FIG. 5. The connector 1 then can be mounted in the recess 13a of the connector receptacle 13. The dimensions at the opening of the recess are selected to enable the mounting error shown in FIG. 3(B) to be corrected or detected during the mounting of the connector 1.

Next, the toggle lever 16 is raised to bring the testing device 14 and the connector receptacle 13 adjacent to each other and into a testing state. Thus, the terminals 4 of the connector 1 held in the connector receptacle 13 are brought into contact with the corresponding probe pins 15 to conduct an electrical connection test. Simultaneously, the testing device 20 checks the ajar state of the cover 5 of the connector 1.

Figure 9:
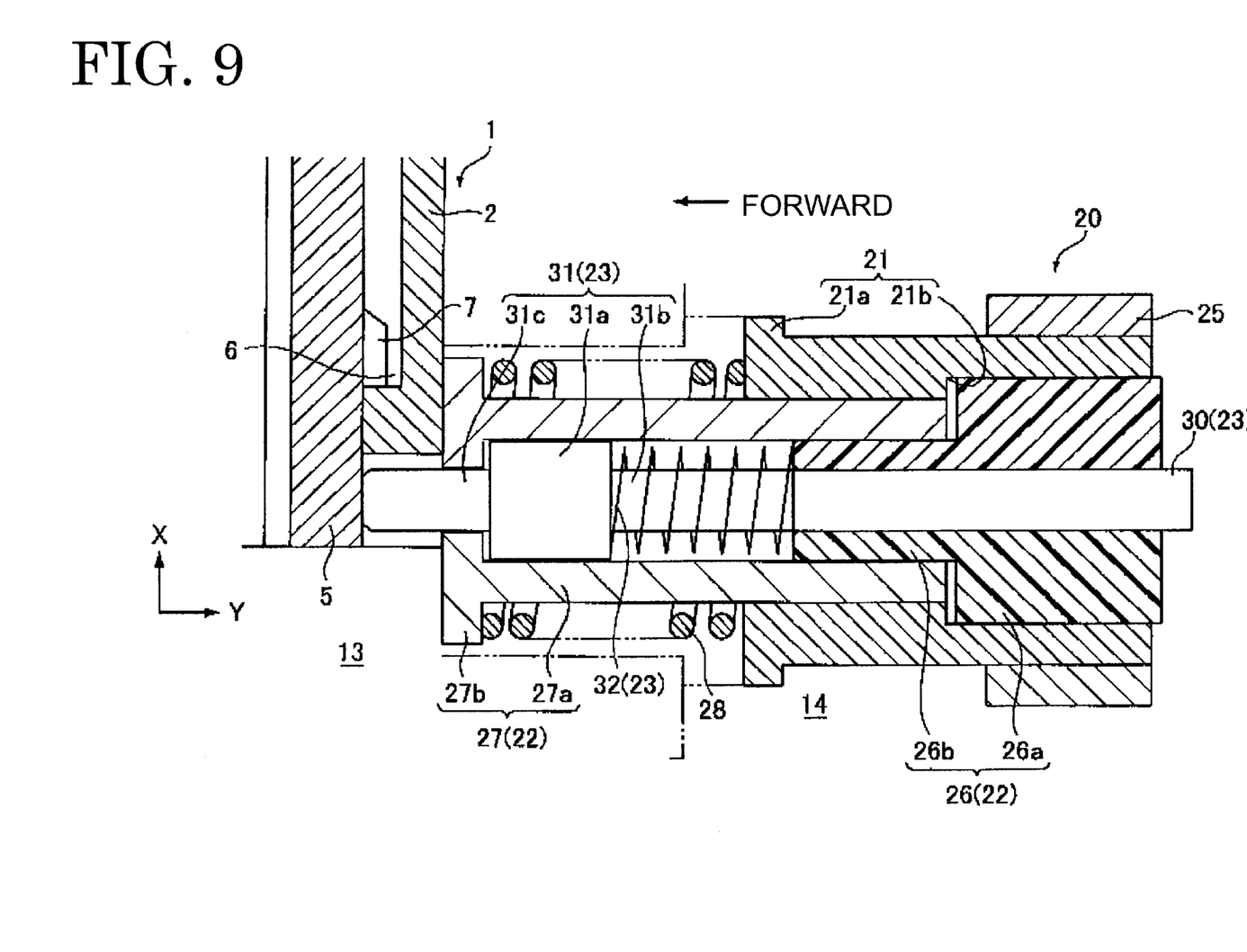
FIG. 9 is a schematic enlarged partial section showing a mount testing state in the embodiment of FIG. 5.

Displacement of the testing device 14 to its testing position brings the conductive sleeve 27 of the outer sleeve 22 of the testing unit 20 elastically into contact with the housing 2 of the connector 1, as shown in FIG. 9. The dimensions described with respect to FIG. 8 cause the movable pin 31 of the switch pin 23 to retract backward and into electrical connection with the fixed pin 30 when the contact portion 31c contacts the bottom surface of the cover 5 that has been mounted in a proper position. In this way, the mount testing circuit S detects the contact formed by the pins 30, 31, and the connector 1 is identified as a good product. The contact position of the inner sleeve 22 with the housing 2 is set in advance at a position where the inner sleeve 22 is retracted backward. Thus, the inner sleeve 22 can take up dimension-varying factors, such as deformation of the housing 2 and shaking in the connector receptacle 13. As a result the switch pin 23 can be positioned precisely.

Figure 10:
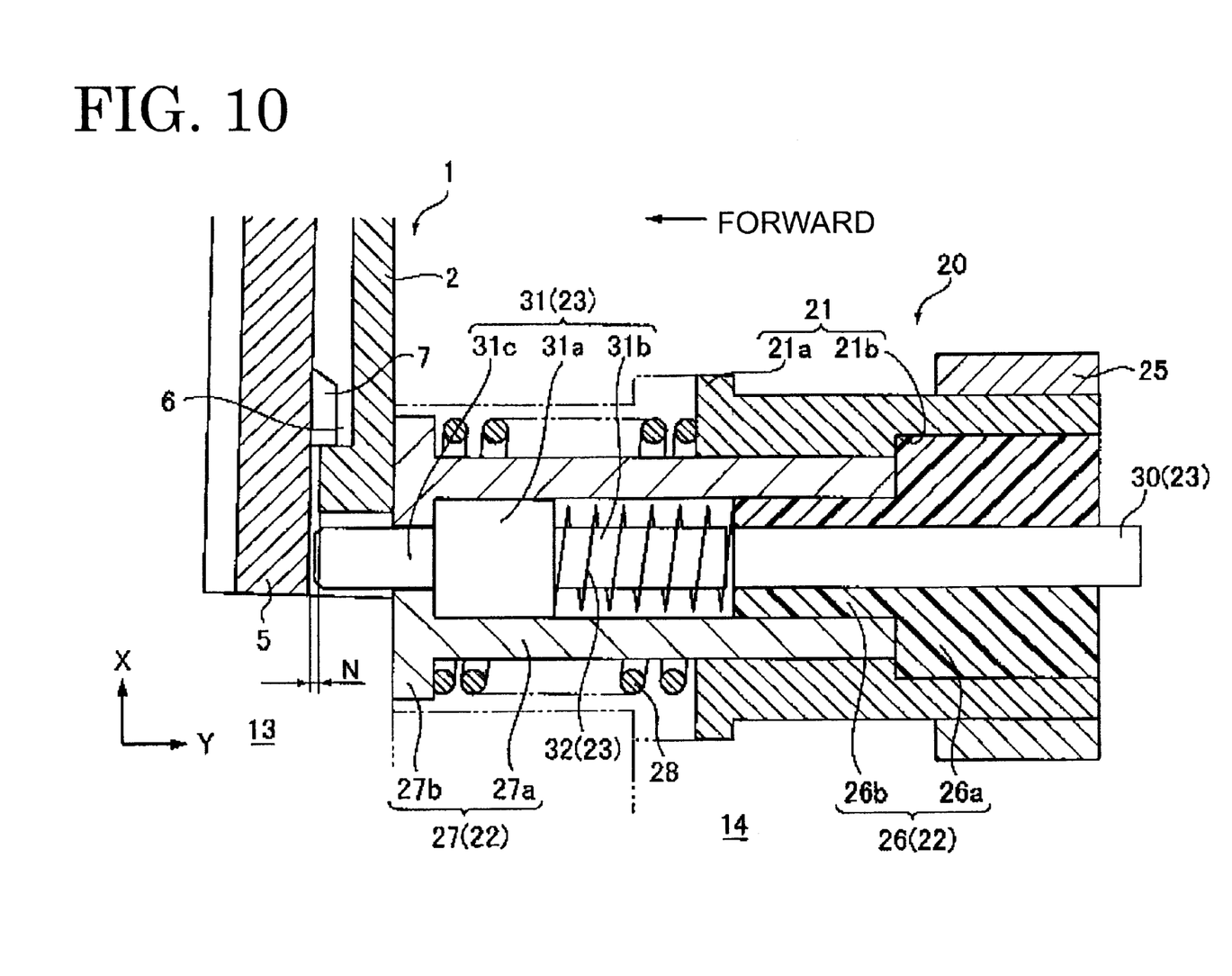
FIG. 10 is a schematic enlarged partial section showing a mount testing state in the embodiment of FIG. 5.

The cover 5 of the connector 1 may experience the mounting error shown in FIG. 4(B). In this situation, as shown in FIG. 10, the inner sleeve 22 contacts the bottom surface of the housing 2, as in the case where the cover member 5 is mounted properly mounted. However, the distance between the bottom surface of the housing 2 and the bottom surface of the cover member 5 is larger than a proper distance. Therefore, the contact portion 31c that projects from the inner sleeve 22 cannot reach the bottom surface of the cover 5 even if the projecting distance N in FIG. 10 is a very small value of about 0.300 mm. This leaves the contact formed by the respective pins 30, 31 open. As a result, the mount testing circuit S (see FIG. 8) can detect the mounting error of the cover 5.

As described above, the testing unit 20 detects the ajar state of the cover 5 in locking direction. Thus, the testing performance and reliability of the connector testing apparatus 10 is improved.

The aforementioned embodiment is merely an illustration of a preferable specific example of the present invention, and the present invention is not limited to the foregoing embodiment. Particularly, the testing unit according to the present invention can test not only the connector, but also various other works, such as other types of housings, fuse boxes, protections, etc.

It should be appreciated that various other design changes can be made without departing from the scope of the present invention as claimed.

As described above, the present invention has a remarkable effect of securely detecting a dimensional deviation of a specified part of a work from its tolerance even if the work is experiencing a deformation and/or displacement. Thus, according to the present invention, testing performance and reliability can be improved.

What is claimed is:

1. A testing unit for detecting a dimensional deviation of a specific part of a work piece beyond its tolerance, comprising:
    an outer sleeve fixed in a specific position,
    an inner sleeve slidably mounted in the outer sleeve and having a protecting distance toward the work piece restricted by a step on the outer sleeve, the inner sleeve being disposed for resiliently contacting a first portion of the work piece, and
    a switch for detecting whether the dimensional deviation of the work piece exists at first and second positions, the switch comprising a rear pin slidably mounted in the outer sleeve and a front pin that is movable with respect to the rear pin, the front pin being slidably mounted in the inner sleeve wherein an electrical relationship between the rear pin and the front pin is changed when the front pin contacts the work piece in the proper position of the work piece.

2. The testing unit of claim 1, further comprising a sleeve biasing member between the inner sleeve and the outer sleeve for biasing the inner sleeve toward the work piece and a pin biasing member between the front and rear pins for biasing the front pin toward the work piece.

3. The testing unit of claim 1, wherein the front pin is slidable in the inner sleeve for continuous electrical contact with the inner sleeve, the rear pin being insulated from the inner and outer sleeves and being biased away from the front pin, whereby the front pin is urged into contact with the rear pin when there is no dimensional deviation of the work piece for completing an electrical connection between the front and rear pins, and wherein the front pin remains biased from a rear pin when there is a dimensional deviation of the work piece.

4. A connector testing apparatus for testing a connector having a housing and a fittable member insertable into the housing in a fitting direction, the fittable member having a locking portion to be locked into the housing in a locking direction arranged at an angle to the fitting direction, comprising:
    a testing unit for detecting a deviation of the locking portion of the fittable member, the testing unit comprising a resilient contact for resiliently contacting the housing, and a detecting portion on the resilient contact for detecting the deviation of the locking portion at a contact position where the resilient contact is in contact with the housing, the detecting portion including a rear pin and a front pin, the front pin being biased away from the rear pin and toward the fittable member of the connector, the front pin being urged into contact with the rear pin when the locking portion is properly engaged with the housing for detecting the deviation of the locking portion.

5. A The connector testing apparatus of claim 4, further comprising:
    a connector receptacle for holding the connector,
    a testing device facing the connector receptacle and adapted to test an electrical connection of the connector held by the connector receptacle, and
    means for relatively displacing the connector receptacle and the testing device (14) toward and away from each other between a separated state (FIG. 5) where they are separated from each other and a testing state where they are adjacent to each other,
    wherein the testing unit is provided in the testing device for testing a mounted state of the fittable member mounted on the connector held by the connector receptacle in the testing state, and
    wherein the resilient contact is elastically engageable with the housing of the connector held by the connector receptacle in the locking direction.

6. The connector testing apparatus of claim 5, wherein the testing device is spaced from the testing unit.

7. Th connector testing apparatus of claim 4, wherein the detecting portion is disposed substantially concentrically within the resilient contact, the resilient contact having an outer sleeve fixed in a specific position and an inner sleeve biased toward the housing an away from the outer sleeve, the front pin of the detecting portion being movable independently relative to the inner sleeve of the resilient contact and being biased independently of the inner sleeve of the resilient contact.

* * * * *